(12) United States Patent
Ramappa et al.

(10) Patent No.: US 6,607,927 B2
(45) Date of Patent: Aug. 19, 2003

(54) METHOD AND APPARATUS FOR MONITORING IN-LINE COPPER CONTAMINATION

(75) Inventors: Deepak A. Ramappa, Orlando, FL (US); Damon Keith DeBusk, Fleetwood, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/968,243

(22) Filed: Sep. 28, 2001

(65) Prior Publication Data

US 2003/0064533 A1 Apr. 3, 2003

(51) Int. Cl.$^7$ .......................... H01L 21/66; G01R 31/26
(52) U.S. Cl. ...................... 438/14; 438/11; 438/16; 438/18; 438/687
(58) Field of Search .............................. 438/10, 11, 13, 438/14, 16, 17, 18, 687; 324/451, 765, 726, 72, 72.5, 98

(56) References Cited

U.S. PATENT DOCUMENTS

| | | | |
|---|---|---|---|
| 5,742,176 A | * | 4/1998 | Kato et al. .................. 324/765 |
| 5,930,586 A | | 7/1999 | Jain et al. |
| 6,150,175 A | | 11/2000 | Shelton et al. |

OTHER PUBLICATIONS

Ramappa et al, "Quantitative Analysis of Copper Contamination in Silicon by Surface Photovoltage Minority Carrier Lifetime Analysis", AIP Conf. Proceedings No. 55 pp215–219, Characterization and Metrology for ULSI tech 2000, International Conf Jun. 2000.*

* cited by examiner

Primary Examiner—Carl Whitehead, Jr.
Assistant Examiner—Thanhha Pham
(74) Attorney, Agent, or Firm—John L. DeAngelis, Jr.; Beusse Brownlee Bowdoin & Wolter, P.A.

(57) ABSTRACT

A method for determining copper contamination on a semiconductor wafer is disclosed. The minority carrier diffusion length is measured, then the wafer is activated by the application of optical or thermal energy. Likely the wafer is also contaminated with iron and thus it is necessary to separate the diffusion length effects caused by the iron from those caused by the copper, that is, both copper and iron contaminants cause a reduction in the minority carrier diffusion length. The applied energy causes the iron-boron pairs to dissociate and also causes the copper to form a metastable copper silicide state. After about 24 to 36 hours, the iron-boron pairs reform and therefore the iron contaminants no longer influence the diffusion length. At this point the diffusion length is measured again, which values are due solely to the copper contamination, since the copper remains in the silicide state. The copper contamination can be determined from the measured diffusion length values.

12 Claims, 6 Drawing Sheets

METHOD AND APPARATUS FOR MONITORING IN-LINE COPPER CONTAMINATION

FIELD OF THE INVENTION

The present invention relates generally to semiconductor manufacturing processes, and more specifically to monitoring and determining copper contamination during the manufacture of integrated circuits on semiconductor wafers.

BACKGROUND OF THE INVENTION

Semiconductor devices are very vulnerable to several different types of contaminants that can affect the physical and electrical properties of the device by lowering the processing yield, changing device performance, and decreasing the device reliability. Yields decrease when contaminants alter the inherent properties of the various material layers and the cleanliness of surfaces. Device parametric values, such as threshold voltage or capacitance, are also changed by such contaminants. Since certain metallic contaminants are mobile, they may not be detected under typical device testing immediately after fabrication, but gradually diffuse inside the device and settle in electrically sensitive areas, causing failures long after the test process has been completed and the device is in use.

Contaminants that are inadvertently added during the processing of a device can be broadly classified into particles and chemical/metallic contaminants. Many such contaminants are present in the various chemicals and fabrication equipment commonly used in semiconductor processing. Due to the ever decreasing feature sizes and thinner deposition layers, devices continue to suffer increasing vulnerability to such contaminants. Because the desired effects of a semiconductor device are achieved using very small quantities of dopants, small quantities of electrically active contaminants can alter the electrical characteristics, changing the device performance and its reliability parameters. A major source of such contaminants are ionic contaminants, that is, atoms and minerals that exist in the semiconductor in ionic form. These metallic ions are highly mobile in the semiconductor material and can therefore cause the device performance characteristics to change during operation, although the device had previously passed electrical testing immediately following fabrication. All fabrication process operators strive to reduce contaminants and to detect those that find their way into the process stream.

It is known that copper contamination of an integrated circuit can significantly change the device functional characteristics. For example, unexpected copper contaminants can cause the capacitance of a contaminated wafer site to differ significantly from the desired design capacitance. Also, like all semiconductor crystal impurities, copper contamination introduces one or more discrete energy levels into the silicon and/or dielectric band gaps between the conduction band and the valence band. These defects form generation/recombination centers (also referred to as traps) that affect the device operation, acting as recombination centers when there are excess carriers in the semiconductor, and as generation centers when the carrier density is below an equilibrium value (e.g., in the reverse-biased space-charge region of a pn junction).

The present trend in the integrated circuit fabrication industry is moving toward more frequent use of copper damascene interconnect processes, and the decreased use of aluminum interconnects. As a result, there are increased opportunities for copper contamination during the fabrication process. This is especially problematic because copper, among all transition metal impurities, exhibits the highest diffusivity and solubility in silicon. Even trace copper contamination can significantly degrade circuit performance and fabrication yields. As a result, during the fabrication process, barrier layers are employed to prevent diffusion of copper from a copper interconnect into an active device area. But trace copper contaminants can also find their way into the active areas through the use of common metrology and cosmetic inspection tools and fabrication facilities (e.g., diffusion or rapid thermal anneal furnaces) for both copper and non-copper interconnected integrated circuits. During testing, some of these tools require physical contact to a chip's metal layer, resulting in adhesion of residual metal particles on the tool after the test has been completed. For example, electrical probe tips frequently show signs of copper contamination after use on a copper-interconnected wafer. Cross-contamination of copper occurs later when the tool is used on a device active area during the fabrication process. In process furnaces, copper is readily volatized even at high temperatures, due to the gettering effect of the furnace ambients, contaminating active surfaces of wafers in the thermal processing tube and adhering to the thermal processing tube walls, possibly contaminating future wafers processed through the furnace. A single copper-contaminated chamber or tool may affect front and/or back end processing of hundreds of subsequent wafers. One potential solution, the purchase of two sets of tools, one for copper-interconnected integrated circuits and the other for non-copper interconnected circuits, is generally considered cost prohibitive.

One prior art technique for measuring copper and other contaminant densities is x-ray fluorescence (XRF). It is known that incident x-rays are absorbed, emitted, reflected or transmitted from a solid. In the x-ray fluorescence process, incident x-rays on the sample are absorbed by ejecting electrons from the atomic K-shell. Then electrons from higher levels, for example the L-shell, drop into the K-shell vacancies and the liberated energy is emitted as characteristic secondary x-rays. The total reflection XRF (TXRF) technique, illustrated in FIG. 1, is one in which x-rays strike the sample at a very shallow angle, penetrating only a small distance into the sample. An x-ray source 12 produces x-rays that are targeted, via a path 14a, to a monochromator 16, which filters out all but a specified x-ray wavelength and focuses the resulting x-ray signal, via a path 14b, to a specified point 18 on a wafer 20. The reflected x-rays are illustrated by a path 14c. Standing waves are formed above the wafer 20 and detected in a detector 22, which is located within about one mm of the wafer surface. Due to the near total reflection of the incident x-ray, the wafer 20 contributes very little to the spectrum in the standing wave. The x-ray energy in the standing wave identifies the impurity type, and the energy intensity provides a measure of the impurity density. Typical analysis areas are one $cm^2$ although advanced instruments can analyze areas as small as $10^{-6}$ to $10^{-5}$ $cm^2$.

To determine the presence of contaminants, a typical TXRF tool requires approximately 1000 seconds to monitor a four $mm^2$ wafer region. Because a single four $mm^2$ area on an eight inch wafer is a relatively insignificant amount of surface area from which to determine whether or not contamination exists across the entire wafer, a number of such regions must be tested by the TXRF tool. Typically, when looking for copper contaminants, a minimum of three to nine sites are checked. If five sites are checked, the process consumes a total of 5000 seconds or approximately 80 minutes to accurately determine whether or not contamination exists at the five sites. Because this detection time is relatively long compared with other steps in the integrated circuit fabrication process, it is not feasible to test more than about nine sites on a wafer and further not feasible to test every wafer for contamination in an in-line process. Also, the information produced by the TXRF analysis requires several days of evaluation to finally yield detailed copper contamination results. Because the process checks only a few wafer regions, the process does not yield accurate data as to the distribution of the copper contamination across the wafer. In fact, the TXRF tool can miss contaminants because it checks only a limited number of discontinuous wafer regions. For example, if contamination exists on an edge of the wafer that was not chosen to be evaluated, likely the wafer would be passed as uncontaminated, when in reality there is significant contamination that can be passed along to other wafers during the fabrication process. Ideally, quantitative data as to the distribution of contaminants across the wafer surface is desired.

To overcome certain drawbacks of the TXRF process, statistical sampling and analysis can be utilized to provide insight into the distribution of the copper contaminants across the wafer surface. For instance, a wafer can be pulled from the fabrication process at given intervals and checked for copper contaminants. After creating a historical contaminant data base, statistical analysis will determine the likelihood and extent of copper contamination in the fabrication process. But in some fabrication facilities, wafer analysis is not conducted until a tool is believed to be contaminated. Wafer analysis at this point cannot detect past contamination, during which significant cross-contamination of fabrication tools can occur, with the attendant reduction in yield and reliability. It should also be noted that when a wafer is removed from the line for a contamination analysis, other wafers continue to be processed through a potentially contaminated tool. Thus numerous additional wafers may be contaminated while the test wafer is undergoing analysis. For example, if a metal deposition and the subsequent chemical/mechanical polishing process takes six minutes per wafer, while the contamination analysis requires 80 minutes per wafer, as many as ten wafers will be subjected to a contaminated metal deposition system before the contamination analysis on the test wafer is completed.

The TXRF technique discussed above identifies contaminants in a range of about $10^9$ to $10^{10}$ cm$^{-2}$. This sensitivity can be further improved through hydrofluoric acid condensation, also referred to as vapor phase decomposition TXRF. In this technique, the wafer includes either a native or thermally grown oxide, which produces water as byproduct upon exposure to hydrofluoric acid vapor. The hydrofluoric acid etches the oxide, including the impurities therein, and the resulting water droplets or moisture film also contains the impurity elements. The impurities are collected in situ by scanning the surface with a second water droplet. The residue is allowed to dry and is measured by the TXRF process. Inherently, the process assumes that the water droplet carries all the surface contaminants with it, and it enhances the sensitivity to about $10^8$ cm$^{-2}$, for iron, for example.

One device parameter that is specifically affected by metal contaminants is the minority carrier diffusion length. Iron and copper contaminants are very detrimental as they have a significant affect on this parameter. Other metals including, chromium, molybdenum, nickel and cobalt, are present in smaller quantities, and therefore have a lesser impact on the diffusion length. In addition to affecting the minority carrier diffusion length, metallic contamination at the semiconductor-oxide interface (for instance of a MOSFET device) degrades the oxide integrity. Iron contamination increases the oxide defect density significantly. Metals also degrade device performance if located at high stress points and in space charge regions created at the interface of opposite-conductivity materials. In addition to the heavy metal contaminants affect on diffusion length, oxygen precipitated silicon crystalline defects and oxidation induced defects, especially stacking faults, also contribute to minority carrier diffusion length degradation.

SUMMARY OF THE INVENTION

The diffusion length of a p-type semiconductor wafer is measured to determine the copper contaminant concentration. In a p-type material is influenced by various contaminants and other physical characteristics of the semiconductor. For example, the diffusion length could be affected by iron and copper, and many other contaminants to a lesser extent. To isolate the diffusion length associated with the copper, it is first necessary to separate the iron and copper effects from the others. This is accomplished by optically activating (or alternatively, thermally activating) the wafer to change only the copper and iron states. The iron is then allowed to repair to its original state, thus isolating the effects of the copper contamination on the diffusion length. By comparing the initial diffusion length prior to activation and the diffusion length after the iron has repaired to its pre-activation state, the copper-induced diffusion length effects can be isolated and from this diffusion length value, the copper contaminant concentration can be determined.

BRIEF DESCRIPTION OF THE DRAWINGS

For better understanding of the present invention, reference may be made to the following detailed description, taken in conjunction with the accompanying drawings, in which.

DETAILED DESCRIPTION OF THE INVENTION

Figure 1:
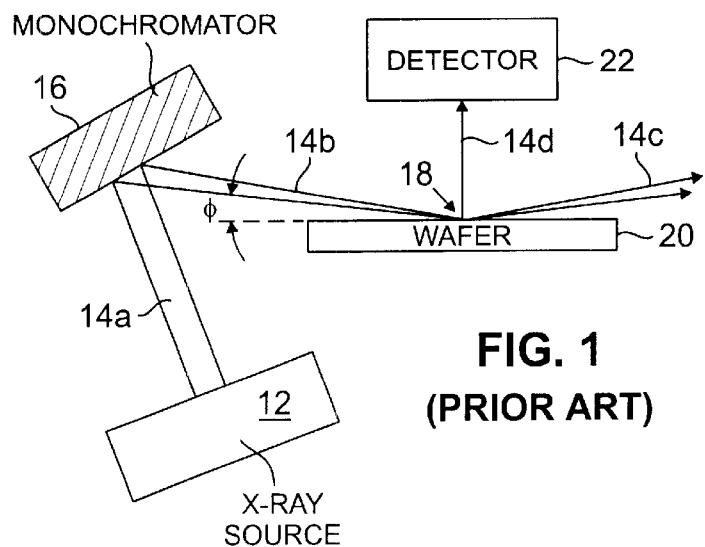
FIG. 1 is a block diagram of a prior art total X-ray reflection device.

While the invention has been described with reference to preferred embodiments, it will be understood by those skilled in the art that various changes may be made and equivalent elements may be substituted for elements of the invention without departing from the scope of the present invention. In addition, modifications may be made to adapt a particular situation to the teachings of the present invention without departing from its essential scope. Therefore, it is intended that the invention not be limited to the particular embodiment disclosed as the best mode contemplated for carrying out this invention, but that the invention will include all embodiments falling within the scope of the appended claims.

According to the present invention, rather than attempting to measure the contaminant concentration directly, as taught by the prior art, it is instead determined from diffusion length measurements. However, the various factors influencing the minority carrier diffusion length must first be nullified so that measurement of the diffusion length serves to identify the metallic contaminant of interest, e.g., copper, and its concentration. It is known that the minority carrier diffusion length is proportional to the square root of the carrier lifetime. It is further known that the minority carrier lifetime is inversely proportional to the metallic contaminant density. Thus certain contaminant concentrations can be determined by measuring the diffusion length, so long as the contaminant's effect on the diffusion length is first isolated from the other factors that effect the diffusion length. In particular, to measure the copper contamination concentration, the effect of other contaminants on the diffusion length must first be removed, especially the effect of iron contaminants.

It is known that iron forms molecular pairs with boron. At room temperature an iron-contaminated boron-doped silicon wafer will contain iron-boron pairs. Upon heating the wafer to approximately 200° C. for several minutes or illuminating the wafer, the iron-boron pairs dissociate into interstitial iron and substitutional boron. The minority carrier recombination effects of interstitial iron differ from those of iron-boron pairs, and thus the minority carrier diffusion length is different when iron is paired with boron than the diffusion length when iron is in an interstitial state. Therefore by measuring the diffusion length before and after the iron-boron pair dissociation, the iron concentration ($N_{Fe}$) can be determined according to the equation below, with the diffusion length in microns.

$$N_{Fe} = 1.0E16(1/L^2_{nf} - 1/L^2_{ni}) cm^{-3},$$

where $L_{nf}$ is the diffusion length after the iron-boron dissociation (i.e., the iron is in an interstitial state) and $L_{ni}$ is the diffusion length before the iron-boron dissociation (i.e., the iron and boron are paired).

According to the present invention, to determine the copper contamination in a wafer, the minority carrier diffusion length affects due to copper must be separated from those due to all other contributors, especially iron. To accomplish this, the wafer is optically activated, causing the iron and copper contaminants to change state, i.e., the iron-boron pairs dissociate into interstitial iron and substitutional boron and the copper attains a stable copper silicide state. No other wafer contaminant or defect is affected by optical activation, and they therefore do not contribute to the diffusion length change that occurs after the activation. Thus the difference in the diffusion length before and after the optical activation is due solely to the iron and copper state changes.

Having at this point isolated the diffusion length effects due to iron and copper, the iron influence is then further segregated from the copper influence. By maintaining the device at room temperature after activation, the change (i.e., decrease) in diffusion length due to the iron contamination is recovered back because the iron-boron pairs reform at room temperature. The optical activation causes the copper to attain a stable copper silicide state, and no further copper state changes occur while the wafer is held at room temperature. Therefore, the change in the minority carrier diffusion length from before activation to after the iron-boron pairs have reformed is due solely to the copper contaminants. By measuring these two diffusion length values, the copper contaminant density can be determined.

Figure 2:
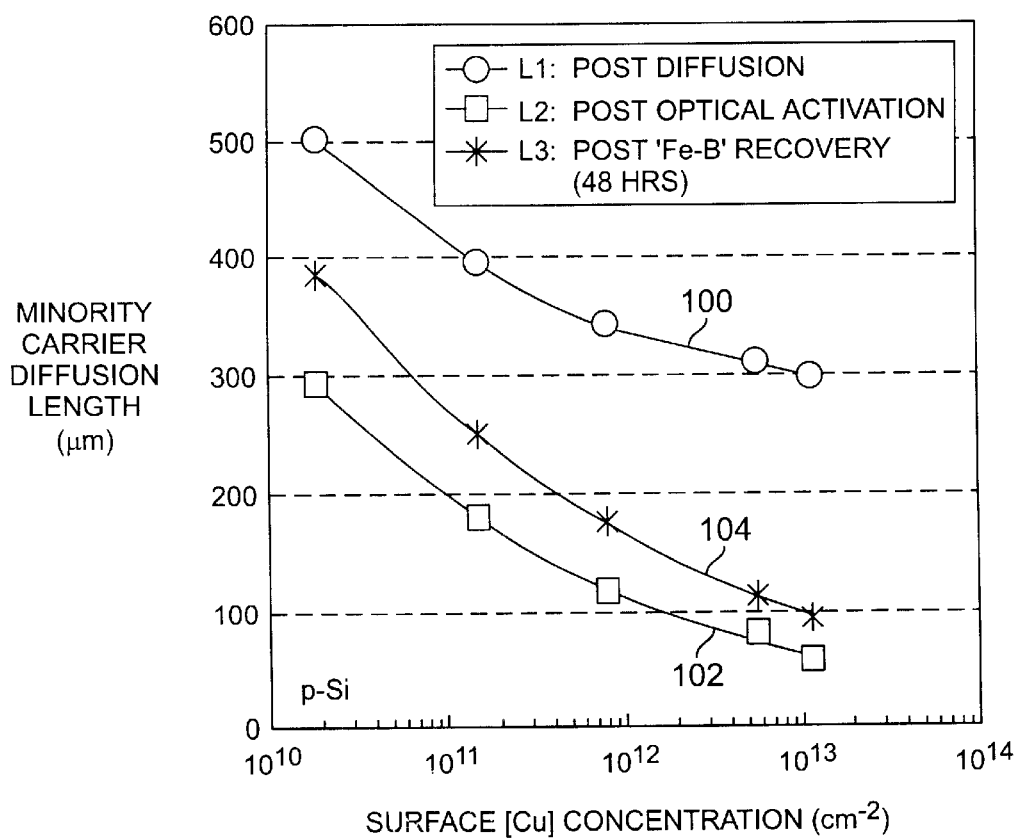
FIG. 2 is a graph illustrating certain characteristics of copper contamination in silicon.

The relationship between the copper contamination concentration of a semiconductor wafer and the attendant affect on diffusion length has been determined by the following experimental process. Five different test or monitor wafers were each intentionally exposed to a different copper surface contamination. See FIG. 2. A curve 100 shows five different copper surface concentration values (represented by circles) and the minority carrier diffusion lengths (on the y-axis) measured on these wafers after a furnace anneal. The furnace anneal drives the copper from the top surface of the wafer (approximately the upper 100–300 μm) into the wafer bulk. The surface concentration values, as plotted on the x-axis, are determined by a TXRF process. The diffusion length values plotted on the y-axis were determined by surface photovoltage measurements.

Following an optical activation procedure, the diffusion length values change to those illustrated by a curve 102, with the five plotted values represented by squares.

The change in diffusion length from the curve 100 to the curve 102 is due to the state changes of iron and copper caused by the optical activation, as discussed above. The copper transforms into a stable silicide state and all the iron-boron pairs are dissociated. Typical optical activation times are in the range of 2 to 15 minutes. Thermal activation of approximately 15 minutes duration at 300° C. can be used in lieu of the optical activation. After about 24 to 36 hours at room temperature, all the iron-boron atoms repair into metastable pairs, causing the diffusion length to increase from the curve 102 values to the values shown by a curve 104 (represented by x's). During this time, the copper atoms do not exhibit any diffusion length recovery, i.e., the copper atoms do not change state and thus the difference in diffusion lengths between the curves 100 and 104 is due solely to the copper contaminants.

Figure 3:
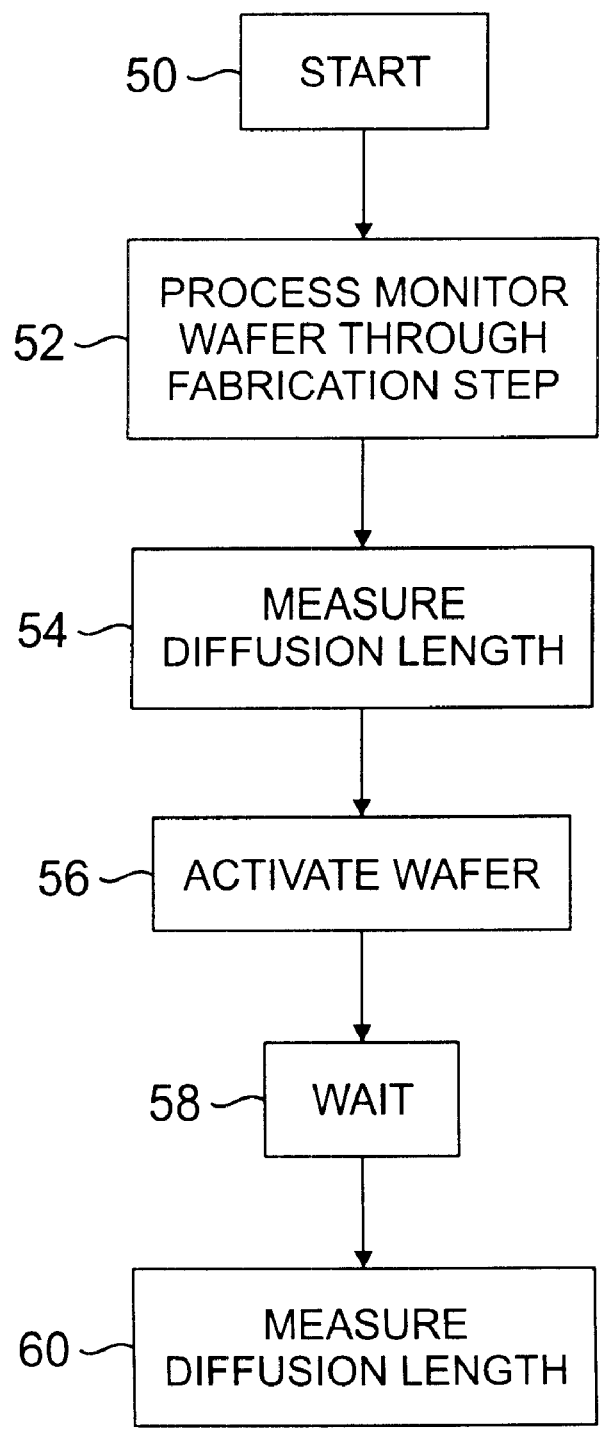
FIG. 3 is a flowchart according to one embodiment of the present invention.

The process according to the present invention for determining copper contamination concentration begins at start step 50 of FIG. 3. Typically, a monitor or test wafer is processed through a processing step that is suspected of copper contamination, as shown at a step 52. The step 52 may involve, for instance, processing the wafer through a suspected diffusion furnace or probing the test wafer with a suspected tool. Alternatively, the wafer can be processed through any step in the fabrication process for measuring any copper contamination associated with that step, even if that step is not suspected. For example, a monitor wafer can be processed daily through selected or all fabrication process steps to check for copper contamination.

The diffusion length is measured at a step 54, preferably using a surface photovoltage tool. It is known that such tools can measure the diffusion length over up to 6200 sites on a wafer in less than about 12 minutes. The surface photovoltage method is a steady-state technique for determining the minority carrier diffusion length using optical excitation. One surface of the wafer is chemically treated to induce a surface space-charge region, which is the result of surface charges and not due to any bias voltages. The surface with the induced space charge region is uniformly illuminated in one embodiment with chopped monochromatic light of an energy higher than the band gap of the wafer material. The back surface of the wafer is kept in the dark. The light is chopped to enhance the signal to noise ratio. The wavelength is varied during the measurement process. Electron-hole pairs are generated by photons absorbed in the material and some of the minority carriers diffuse toward the illuminated surface, which establishes a surface potential or surface photovoltage relative to the grounded and dark back surface. This surface photovoltage is proportional to the excess minority carrier density at the edge of the space charge region. For low level injection, one can determine the excess minority carrier density from the surface photovoltage and thence from the excess carrier density the diffusion length can be determined. See, for example, *Semiconductor Material and Device Characterization* by Dieter K. Schroeder, John Wiley & Sons, 1998, pp. 439–448.

At a step 56, the test wafer is then optically or thermally activated, causing the copper to attain a stable copper silicide state that remains unchanged over time. The iron-boron contaminant pairs in the silicon wafer are dissociated by the activation process. After about 24 to 36 hours (this wait period is designated by the step 58), the iron-boron pairs reassociate. The reassociation of iron-boron pairs can also be alternatively performed and/or accelerated by annealing the wafers at 85° C. for about 15 minutes. Since the iron contaminants are no longer in a free state, they do not serve as recombination centers, and therefore when the diffusion length is now measured again (at a step 60), it is due solely to the copper contaminants.

Using the formula below, the copper defect density can be calculated from the diffusion length before activation ($L_1$) and the diffusion length after the iron-boron pairs have reassociated ($L_3$):

$$N_{Cu} = K(1/(L_3)^2 - 1/(L_1)^2) \text{cm}^{-3}$$

The formula is derived from the fact that diffusion lengths are inversely proportional to the capture cross section of the defect or contaminant, and hence are inversely proportional to the defect or contaminant density. The constant (K), which is dependent on the defect capture cross-section, is approximately $10^{16}$ cm$^{-1}$. Note that according to the nomenclature used herein, $L_2$ is the diffusion length after activation but before the iron-boron pairs have reassociated.

Typically, the copper contaminants are not distributed evenly throughout the wafer, but rather lie primarily within the top 300 microns of the wafer surface. It is known, however, that this distance is dependant upon the activation light intensity or the activation temperature for thermal activation since these processes cause the copper atoms to diffuse farther into the bulk. In fact, copper is mobile in silicon even at room temperature. But, since the device regions are formed in about the top 100 microns of the wafer surface, this is the area where copper contamination is most important. Also, the surface photovoltage measurements determine the diffusion length in approximately this region and therefore the copper contamination in this region.

Prior to wafer processing, the minority carrier diffusion lengths for p-type wafers having equal boron dopant concentrations are usually similar, that is, in the range of about 800 to 1000 microns. However, due to wafer fabrication anomalies there can be significant diffusion length variations from one wafer to another. According to one embodiment of the present invention, the diffusion length is determined prior to initiation of wafer processing to determine if it is within an acceptable range and to establish a baseline diffusion length value for comparison with a latter determined value when copper contamination is suspected. This initial diffusion length baseline determination is not required according to the present invention to later detect copper contamination. However, it may be useful for other fabrication-related purposes to determine that the diffusion lengths are within an acceptable range upon receipt of the wafer, and thus that the wafer appears not have any significant contaminants or defects that would significantly degrade the minority carrier diffusion length.

Figure 4:
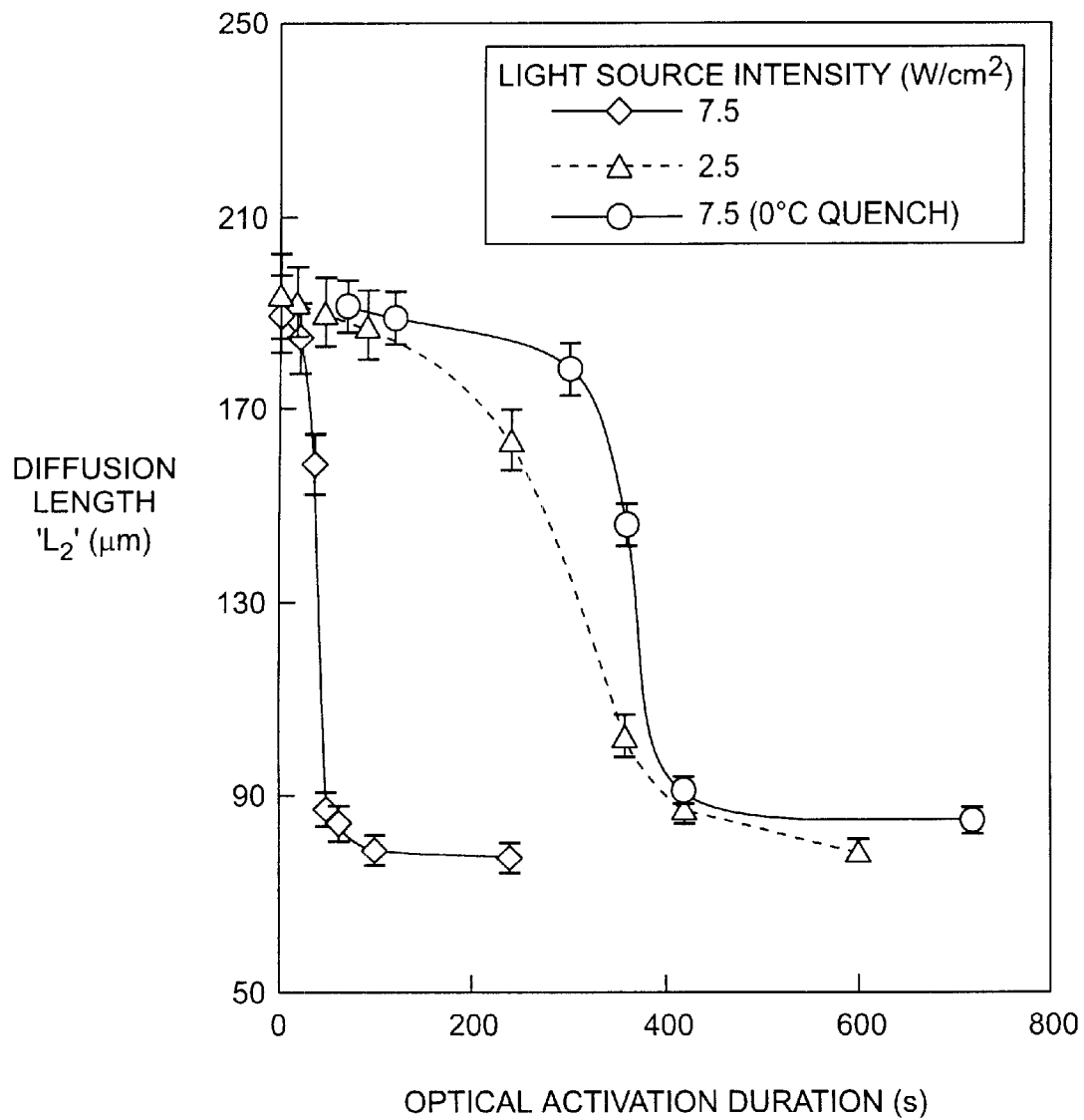
FIGS. 4 through 7 are graphs illustrating certain characteristics of copper and iron contamination in silicon.

FIG. 4 depicts three curves illustrating the diffusion length ($L_2$) in microns as a function of optical activation duration (in seconds) for three different light intensity values, measured in watts per cm$^2$. The diffusion length effects shown in FIG. 4 are due to both iron and copper contaminants, i.e., the iron-boron pairs have not yet reassociated.

Figure 5:
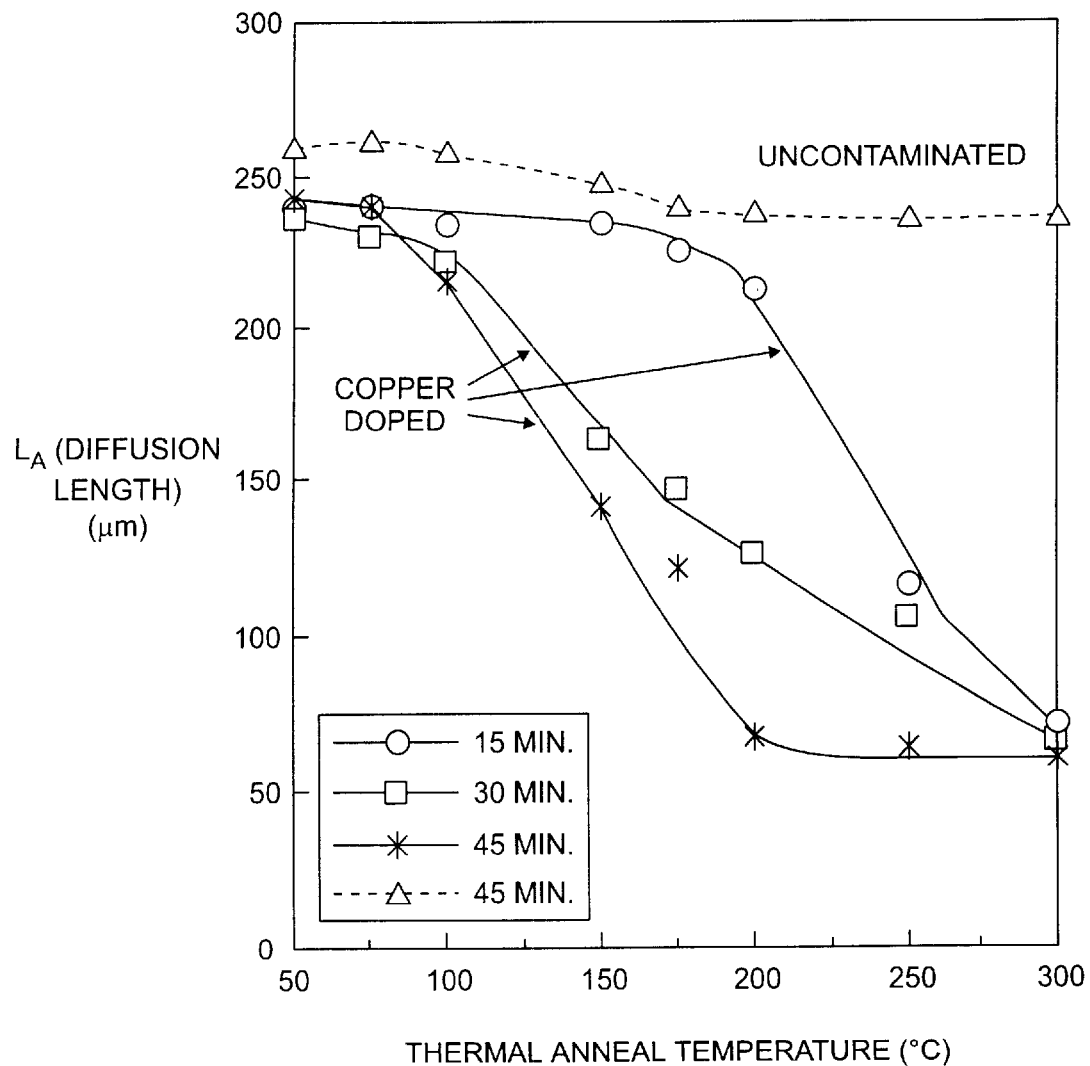

Thermal activation of the wafer has a similar effect on the diffusion length characteristics as optical activation, but a different copper silicide stable state is formed. FIG. 5 depicts three curves showing the diffusion length as a function of the thermal anneal temperature (° C.) for three different anneal durations. The fourth curve depicts the effects on a wafer uncontaminated by copper and iron, and thus the diffusion length change is minimal for all anneal temperatures, as can be seen.

Figure 6:
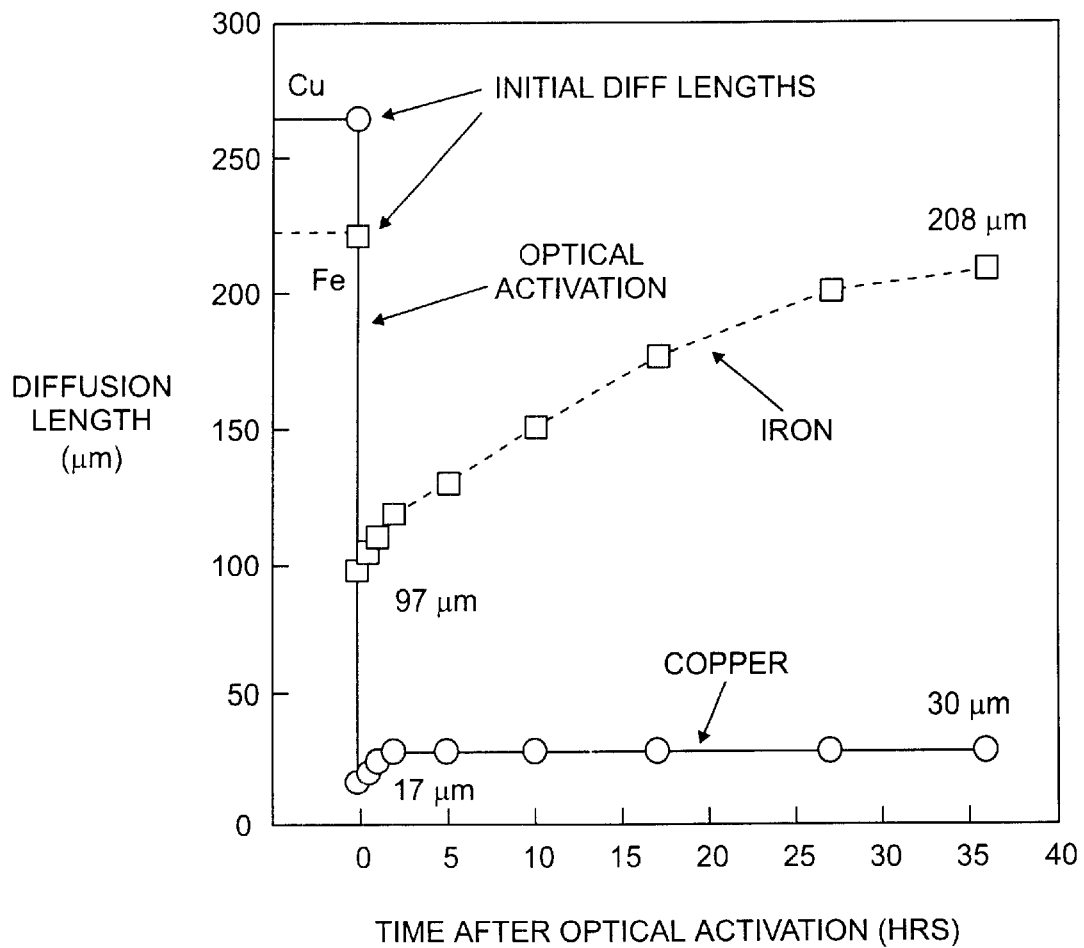

FIG. 6 illustrates the diffusion length change as a function of the duration since optical activation (measured in hours). At time t=0 a copper contaminated wafer has a diffusion length of approximately 260 microns and iron contaminated wafer has a diffusion length of approximately 225 microns. After optical activation, the iron-contaminated wafer diffusion length falls to 97 microns, but recovers to nearly its initial value after approximately 35 hours at room temperature. After optical activation the copper-contaminated wafer has a diffusion length of approximately 17 microns and changes only slightly (to about 30 microns) over the same 35 hour period. The experimental results presented in FIG. 6 allow the determination of the copper contamination, after the optical activation and iron-boron recovery, in accordance with the teachings of the present invention. As discussed above, the copper contaminated wafer does not show any diffusion length recovery, whereas the iron contaminated wafer almost completely recovers the original diffusion length. This difference between the copper and iron reactions to the optical activation and the recovery time allow the delineation of the copper and iron contaminant affects and further the detection and determination of copper contamination in p-type silicon in accordance with the present invention.

The effects of iron and copper contamination on a p-type material are not demonstrated by n-type silicon, because the iron or copper contaminants do not exhibit the iron-phosphorous/arsenic pairing and neither does copper precipitate as in the p-type material.

Figure 7:
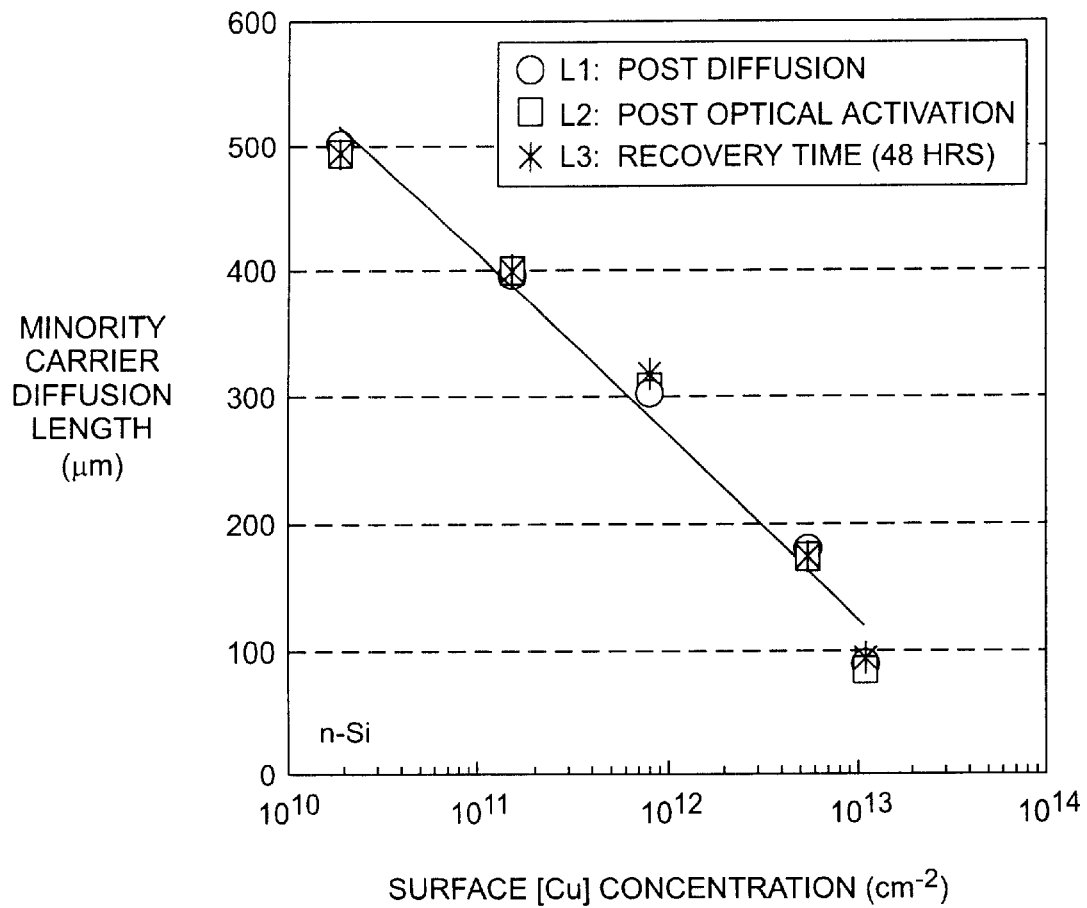

FIG. 7 illustrates the minority carrier diffusion lengths as a function of the copper surface contamination (in cm$^2$) for five different surface contamination values for n-type material. Further, each of the five wafers is subjected to an optical activation step and a recovery time as was the case with the FIG. 1 p-type material. In particular, note that neither the optical activation nor the recovery time affect a change in the diffusion length of the minority carrier holes.

The techniques of the present invention, as set forth above, offer several advantages over the prior art. The present invention is faster and offers better spatial resolution of copper contamination across the wafer surface, because the photovoltage technique allows full wafer mapping, rather than mapping of only six to nine points according to the prior art methods. The surface photovoltage tools are far less expensive than the TXRF tools used in the prior art, and full wafer mapping allows easier detection copper contamination. Since full wafer mapping is achieved, statistical techniques for interpolating copper contamination throughout the wafer surface based on a few measured areas are not required.

A process has been described for measuring copper contamination of a silicon wafer. While specific applications of the invention have been illustrated, the principles disclosed herein provide a basis for practicing the invention in a variety of ways and in a variety of wafer structures.

Although the exemplary embodiment pertain to copper contamination in wafers, numerous variations are contemplated. Other constructions and applications not expressly identified herein do not depart from the scope of the invention, which is limited only by the claims that follow.

What is claimed is:

1. A method for determining copper contamination of a semiconductor wafer comprising:
   (a) measuring the minority carrier diffusion length $L_1$ of minority carriers within the wafer;
   (b) activating the wafer;
   (c) after activating the wafer in the step (b), annealing the wafer at about 85° C. for about 15 minutes;
   (d) measuring the minority carrier diffusion length $L_3$ of minority carriers within the wafer after execution of the steps (b) and (c); and
   (e) determining the copper contamination from the measurements of steps (a) and (d).

2. The method of claim 1 wherein step (b) includes optical activation using a light source with an intensity of at least 2.5 watts/cm$^2$.

3. The method of claim 1 wherein the step (b) includes thermal activation at a temperature of about 300° C. for about at least 15 minutes.

4. The method of claim 1 wherein the step (e) further comprises determining the copper contamination from the following equation, where $L_1$ is the diffusion length according to the step (a) and $L_3$ is the diffusion length according to the step (d), and wherein K is an empirically derived constant, and wherein $N_{Cu}$ is the copper concentration $$N_{Cu}=K(1/(L_3)^2-1/(L_1)^2)\text{cm}^{-3}.$$

5. The method of claim 1, wherein the method is employed in an integrated circuit fabrication process comprising a plurality of fabrication steps to which the semiconductor wafer is subjected, and wherein the method further comprises a preliminary step of subjecting a monitor wafer to a selected step in the fabrication process.

6. The method of claim 1, wherein the method is employed in an integrated circuit fabrication process, and wherein the method further comprises a preliminary step of subjecting a monitor wafer to each step in the fabrication process to determine whether any of the fabrication process steps are causing copper contamination of the semiconductor wafer.

7. The method of claim 1, wherein the method is employed in an integrated circuit fabrication process, and wherein the method further comprises a preliminary step of subjecting a monitor wafer to a selected step in the fabrication process, wherein the selected fabrication process step is suspected to be contaminated with copper.

8. A method for determining copper contamination of a semiconductor wafer, wherein the wafer includes iron contaminants in the form of iron-boron molecular pairs, said method comprising:
   (a) measuring the minority carrier diffusion length of minority carriers within the wafer;
   (b) providing energy to the wafer for dissociating the iron-boron bonds in the wafer;
   (c) allowing the iron-boron bonds to reform by annealing the wafer at about 85° C. for about 15 minutes;
   (d) measuring the minority carrier diffusion length of minority carriers within the wafer after execution of the steps (b) and (c); and
   (e) determining the copper contamination from the minority carrier diffusion length measurements of the steps (a) and (d).

9. The method of claim 8 wherein the step (b) further comprises providing optical energy using a light source with an intensity of at least 2.5 watts/cm$^2$.

10. The method of claim 8 wherein the step (b) further comprises includes providing thermal energy by exposure to a temperature of 300° C. for about at least 15 minutes.

11. The method of claim 8, wherein the method is employed in an integrated circuit fabrication process, and wherein the method further comprises a preliminary step of subjecting a monitor wafer to each step in the fabrication process to determine whether any of the fabrication process steps are contaminated with copper.

12. The method of claim 8, wherein the method is employed in an integrated circuit fabrication process, and wherein a tool is used at each step in the fabrication process, and wherein the method further comprises a preliminary step of subjecting a monitor wafer to a selected step in the fabrication process, wherein the tool associated with the selected fabrication process step is suspected of copper contamination.

* * * * *